United States Patent
Chu et al.

(10) Patent No.: US 6,797,642 B1
(45) Date of Patent: Sep. 28, 2004

(54) METHOD TO IMPROVE BARRIER LAYER ADHESION

(75) Inventors: Karen Chu, Sunnyvale, CA (US); Anil Vijayendran, Campbell, CA (US); Michal Danek, Cupertino, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/267,305

(22) Filed: Oct. 8, 2002

(51) Int. Cl.⁷ .................. H01L 21/31; H01L 21/311
(52) U.S. Cl. ........................ 438/758; 438/694
(58) Field of Search ....................... 438/689, 694, 438/695, 696, 706, 707, 710, 758

(56) References Cited

U.S. PATENT DOCUMENTS

| | | | |
|---|---|---|---|
| 5,950,107 A | 9/1999 | Huff et al. | 438/669 |
| 5,985,762 A | 11/1999 | Geffken et al. | 438/687 |
| 6,287,977 B1 | 9/2001 | Hashim et al. | 438/722 |
| 6,372,301 B1 | 4/2002 | Narasimhan et al. | 427/534 |
| 6,413,858 B1 * | 7/2002 | Chopra | 438/643 |
| 6,424,044 B1 | 7/2002 | Han et al. | 257/758 |
| 6,528,412 B1 * | 3/2003 | Wang et al. | 438/628 |

\* cited by examiner

*Primary Examiner*—David A. Zarneke
*Assistant Examiner*—Scott B. Geyer
(74) *Attorney, Agent, or Firm*—MacPherson Kwok; Chen & Heid LLP; David S. Park

(57) ABSTRACT

The present invention provides a method to improve adhesion of barrier, metal, dielectric interfaces. In the process flow, a first barrier material is formed on a dielectric layer and bombarded with a plasma to effectively push the barrier material into the dielectric interface while leaving a portion of the barrier material over the dielectric. A second barrier material, which may or may not be the same as the first barrier material, is then formed on the remaining first barrier material. Advantageously, the method of the present invention allows the barrier material to be pushed into the dielectric to insure excellent adhesion, which prevents chemical mechanical polishing delamination. Furthermore, the presence of the first barrier material on the sidewalls of via apertures through the dielectric can prevent Cu poisoning from sputtered Cu or $C_xO_y$.

16 Claims, 4 Drawing Sheets

METHOD TO IMPROVE BARRIER LAYER ADHESION

BACKGROUND

1. Field of Invention

The present invention generally relates to semiconductor processing and, more particularly, to a method and structure for improving barrier layer adhesion.

2. Related Art

Current integrated circuits generally include various formations of multilevel metal structures that form a high-conductivity, thin-film network fabricated above the silicon surface to connect various active devices through specific electrical paths. During the formation of metal-to-metal and metal-to-silicon contact structures in this thin-film network, openings are etched in the dielectric layer that separates the substrate or underlying conductive thin film from the overlying conductive thin film. After openings for interconnect structures (lines and vias) have been etched through the dielectric, a diffusion barrier layer is commonly deposited over the dielectric to prevent intermixing or diffusion of interconnect material. A conductive material, such as copper, aluminum, or other metal, is then used to fill the opening and make a connection to the silicon substrate or underlying conductive thin film.

A problem that affects the electrical reliability of the metal layers is the adhesion between a dielectric layer and an adjoining barrier layer that insulates a metal layer. Poor barrier layer-to-dielectric layer adhesion could lead to delamination. Delamination occurs when a portion of the barrier layer peels apart or separates from the dielectric layer, which may cause problems when forming, filling, and electrically contacting a metal line. Thus, in the manufacture of semiconductor devices, it is important to have reliable barrier-to-dielectric layer adhesion.

Delamination of the barrier layer from the dielectric layer may occur for several reasons, including thermal stresses, intrinsic stresses of the film during deposition, etching chemistries, chemical-mechanical polish (CMP) forces applied on the films, and electrical cycling.

One reason that delamination occurs may be the processing which the layers are exposed to prior to the deposition of the barrier layer. For example, when forming vias to provide connection to copper wires, an argon sputter is typically performed as the first step prior to the barrier deposition over the via. The purpose of the argon sputter is to remove a copper oxide film from the copper below the via. Copper reacts with oxygen and easily forms a surface layer of high resistivity copper oxide when exposed to an oxygen rich atmosphere. This oxidation can occur when the wafers, just having the vias etched therein, are moved from an etch tool to a metallization tool. To minimize the resistance of the copper interconnect, the copper oxide layer must be removed, such as with the argon sputter. However, copper and copper oxide will be redeposited on the via sidewalls during the argon sputter creating the possibility of copper diffusing into the dielectric, poisoning it and degrading its electrical insulating capability. Such damage to the dielectric, whether in the field or on the sidewalls, can prevent adhesion to the damaged dielectric.

Another reason delamination may occur is from heat treatment steps during substrate processing. For example, an anneal step may be needed to repair damage to a substrate after a plasma processing step. Such heat cycles may cause the layers to change in stress characteristics or undergo chemical reactions that result in loss of adhesion properties, such as that which occurs between lower-k dielectrics and adjacent diffusion barrier material at high temperatures.

Therefore, what is needed is a method to improve adhesion of the barrier layer to the dielectric layer that can maintain the desired properties of the dielectric layer, such as the dielectric constant and other insulating properties, while remaining bonded during later planarization steps.

SUMMARY

The present invention provides a method for depositing a barrier material to form a barrier layer over an aperture structure etched through a dielectric layer, bombarding the barrier material with a plasma, and again depositing barrier material over the aperture structure to improve adhesion characteristics of the barrier layer.

In one embodiment of the present invention, a method to improve barrier layer adhesion comprises providing a semiconductor structure comprising a dielectric layer overlying a metal layer, etching an aperture through the dielectric layer to expose a portion of the metal layer, depositing a first barrier material to form a barrier layer over the dielectric layer and over the exposed portion of the metal layer, bombarding the barrier layer with a plasma, the bombarding leaving a portion of the barrier layer over a top surface of the dielectric layer, and depositing a second barrier material over the portion of the barrier layer and over the aperture.

In another embodiment, a first barrier material is deposited to form a barrier layer over the dielectric layer and over the exposed portion of the metal layer with the barrier layer having a greater thickness over the dielectric layer than over the exposed portion of the metal layer. The barrier layer is bombarded with an inert plasma to push barrier material into the dielectric layer with the bombarding leaving a portion of the barrier layer over a top surface of the dielectric layer.

Advantageously, the present invention allows for layers that remain bonded through CMP, improved critical fracture energy values that indicate improved adhesion between barrier layers and dielectric layers, and avoidance of dielectric poisoning.

This invention will be more fully understood in light of the following detailed description taken together with the accompanying drawings.

DETAILED DESCRIPTION

FIGS. 1–7 illustrate a process sequence to form a semiconductor structure utilizing a method to improve barrier layer adhesion in accordance with one embodiment of the present invention.

Figure 1:
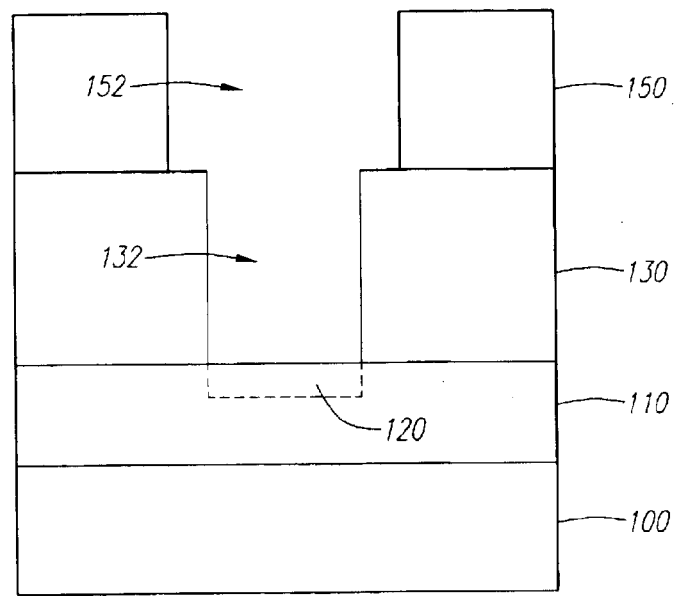
FIG. 1 shows a cross-section view of a semiconductor structure including a metal layer over a substrate with apertures etched through a dielectric material used to contact the metal layer.

FIG. 1 illustrates a cross-section view of one example of a semiconductor device structure or portion of a semiconductor device structure in which the present invention may be used. As shown in FIG. 1, layers of material are formed on a semiconductor substrate 100, which may be doped by conventional means with dopants at different dosage and energy levels to form wells. Substrate 100 may be a wafer formed from a single crystalline silicon material. Substrate 100 may also comprise other materials, for example, an epitaxial material, a polycrystalline semiconductor material, or other suitable material. Substrate 100 should be understood to possibly further include one or more layers of insulating material and/or conductive material and one or more active and/or passive devices and/or multilayer interconnection structures over the active and/or passive devices, formed in or over the substrate or the like.

A metal layer 110 is deposited over substrate 100 using conventional metal deposition techniques, such as chemical vapor deposition (CVD), physical vapor deposition (PVD), electroplating, or other applicable metal deposition techniques. Metal layer 110 may include copper, aluminum, tungsten, titanium, tantalum, or any other applicable metal in accordance with the present invention, but is preferably copper due to the lower resistivity of copper.

Referring again to FIG. 1, dielectric layers 130 and 150 are deposited over metal layer 110. In one example, dielectric layer 130 may have a thickness between about 1,000 Å and about 5,000 Å, and dielectric layer 150 may have a thickness between about 1,000 Å and about 5,000 Å. Dielectric layers 130 and 150 may or may not comprise the same dielectric materials. Dielectric layers 130 and 150 may be formed from materials including but not limited to undoped and doped silicon oxide materials, organic and inorganic polymers, and porous and non-porous entities of the aforementioned materials formed within integrated circuits through methods including but not limited to CVD, PVD sputtering, and spincoating methods.

Thereafter, various techniques and methods may be used to form via and line apertures through the dielectric material for exposing the underlying metal. Such techniques may include "line-first" methods or "via-first" methods or other known approaches, as will be understood by those skilled in the art. Apertures may be formed using standard photoresist coating, exposure, and development processes with conventional patterning techniques.

As shown in FIG. 1, in one example, a via aperture 132 is etched in dielectric layer 130 and a line aperture 152 is etched in dielectric layer 150, exposing a portion of metal layer 110. In a further example, dielectric layers 130 and 150 may be a single dielectric layer with the via and line formed by a timed etch or other suitable etch technique. It is noted that the present invention is not limited to the. aforementioned dielectric thicknesses or configuration of apertures, but may be used for general bonding of barrier layers to dielectric layers, as will be apparent to those of ordinary skill in the art.

As previously noted, copper is highly reactive with oxygen and easily forms a surface layer of high resistivity copper oxide when exposed to an oxygen-rich atmosphere. This oxidation can occur when the wafers, just having the vias etched therein, are moved from an etch tool to a metallization tool. Thus, when metal layer 110 is a copper layer, in one example, a copper oxide layer 120 may be formed, as illustrated in FIG. 1 by dashed lines. Accordingly, to reduce the resistance of the copper interconnect, any copper oxide layer must be removed prior to deposition of the barrier layer and subsequent filling of the apertures.

In accordance with one embodiment of the present invention, barrier material is deposited to form a barrier layer over the apertures and copper oxide layer, the barrier layer is bombarded with plasma, and then barrier material is again deposited to improve adhesion between the barrier layer and dielectric layer. The barrier layer may be in the form of a dual or single damascene structure or a blanket film. Advantageously, the present invention maintains the properties of the dielectric layer, prevents dielectric poisoning, and keeps the layers from delaminating during later polishing steps.

Figure 2:
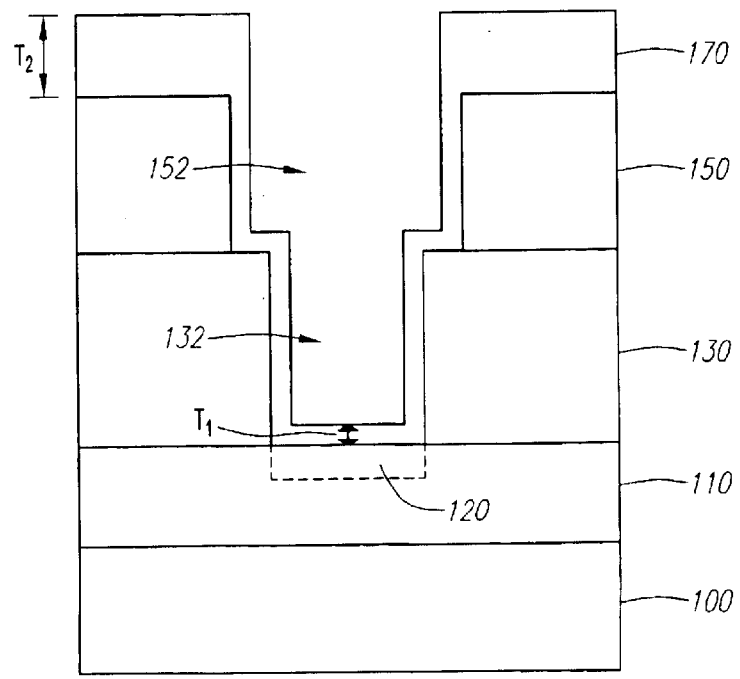
FIG. 2 shows a cross-section view of the structure illustrated in FIG. 1 after a barrier layer is formed over the structure.

In one example, as illustrated in FIG. 2, barrier material is deposited to conformally form a barrier layer 170 over line aperture 152, via aperture 132, and copper oxide layer 120. Barrier layer 170 may be between about 5 Å and about 300 Å in thickness and is preferably about 50 Å in thickness over the field region or top surface of dielectric layer 150 but is not limited to such a range. Furthermore, it is noted that a thickness $T_2$ of barrier layer 170 over the top surface of dielectric layer 150 is greater than a thickness $T_1$ of barrier layer 170 at the bottom of via aperture 132 ($T_2 > T_1$). In one example, barrier layer 170 has a greater thickness $\Delta T (\Delta T = T_2 - T_1)$ over top surface of dielectric layer 150 than at the bottom of via aperture 132 between about 5 Å and about 200 Å. The greater thickness advantageously allows barrier material to remain over the field region during the device processing, as will be discussed in further detail below. Barrier material may be deposited by CVD, PVD, or other appropriate methods to form barrier layer 170. In one example, with no intent to limit the invention thereby, barrier material including TiN(Si) may be deposited in an Inova™ System, available from Novellus Systems, Inc., San Jose, Calif. A flash layer of Si may be formed over TiN in this example to advantageously improve barrier properties.

The barrier material may be a metallic material and is specifically chosen to provide a diffusion barrier for copper in one example. Suitable metallic materials which may be used as the barrier material include tantalum (Ta), tantalum nitride (TaN), titanium nitride (TiN), titanium silicon nitride (TiSiN), tungsten (W), tungsten nitride (WN), tungsten silicon nitride (WSiN), and tantalum silicon nitride (TaSiN).

Figure 3:
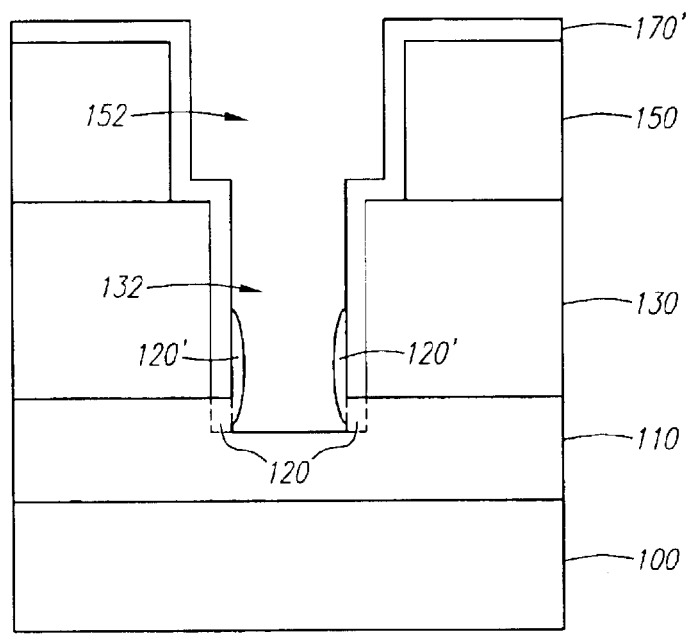
FIG. 3 shows a cross-section view of the structure illustrated in FIG. 2 after the barrier layer is bombarded with plasma.

After deposition of barrier layer 170 (FIG. 2), the semiconductor structure is bombarded with a plasma to form barrier layer 170', as illustrated in FIG. 3. Plasma bombardment removes the barrier material and copper oxide from the bottom of via aperture 132 to expose a portion of metal layer 110 but only removes a portion of barrier layer 170 (FIG. 2) along the sidewalls and field region. Thus, after plasma bombardment, barrier material remains only on the sidewalls and over the top surfaces, advantageously protecting the dielectric material from sputtered copper material as discussed in more detail below. In one example, between about 0 Å and about 300 Å in thickness of barrier layer 170 (FIG. 2) is removed. In one example, barrier layer 170 is between about 5 Å and about 100 Å in thickness and is preferably about 10 Å in thickness over the top surface of dielectric layer 150.

In one embodiment, plasma bombardment is performed with a plasma containing an inert element, such as argon (Ar), to remove portions of the barrier material and copper oxide. Other gases may be used for plasma bombardment, including hydrogen ($H_2$), nitrogen ($N_2$), and helium (He). In one example, plasma ions accelerate toward barrier layer 170 (FIG. 2) via an electrical field (e.g., an RF signal applied to the substrate or substrate pedestal in a processing chamber via an RF power supply, which causes a bias to form on the substrate or substrate pedestal), strike barrier layer 170 (FIG. 2), and, due to momentum transfer, sputter barrier material from barrier layer 170 (FIG. 2) to form barrier layer 170'. Plasma ions are attracted to the substrate in a direction substantially perpendicular thereto, and as a result, substantial sputter of material at the bottom of via aperture 132 occurs. Once barrier layer 170 (FIG. 2) has been removed from the via bottom, plasma ions strike copper oxide layer 120 to expose a portion of underlying metal layer 110. A small amount of copper oxide 120 will remain at the bottom edges of aperture 132, for the example when metal layer 110 is copper. A small amount of sputtered copper material 120', comprising Cu and $Cu_xO_y$, may also remain along a lower portion of the aperture sidewalls, as shown in FIG. 3. However, the remaining copper oxide 120 and sputtered copper material 120 will not have any affect on the contact to the clean copper or the dielectric.

Advantageously, plasma bombardment of the barrier layer and copper oxide effectively pushes the barrier material into the dielectric, thereby enhancing adhesion at the interface of the two materials. Simultaneously, bombardment of the barrier layer creates more reactive sites at the surface of the remaining layer to effectively adhere to subsequently deposited barrier material. Thus, barrier layer 170' covering all of the exposed dielectric (sidewalls and top surfaces) helps a later-formed barrier layer to remain bonded and survive subsequent planarization steps.

Furthermore, removing only a portion of barrier layer 170 (FIG. 2) advantageously protects against copper poisoning. The barrier material remaining in place on the sidewalls and top surfaces effectively insulates dielectric layers 130 and 150 from sputtered copper material 120', thereby preventing any copper and/or copper oxide diffusion into the dielectric which could damage the dielectric material and decrease adhesion characteristics between the barrier layer and dielectric layer. Accordingly, barrier layer adhesion is improved while maintaining the dielectric constant and also preventing the formation of any via-to-via leakage current paths.

In one example, with no intent to limit the invention thereby, the plasma bombardment is performed in a Dama-Clean™ module of an Inova™ System, available from Novellus Systems, Inc., San Jose, Calif. for between about 2 seconds and about 10 seconds, preferably for about 6 seconds, to remove 40 Å of TiN(Si). Source power is set at between about 100 W and about 3,000 W, preferably at about 750 W, and wafer bias is set at between about 0 W and about 1,000 W, preferably at about 750 W. Process pressure is maintained at between about 0.1 mTorr and about 10 mTorr. It will be apparent to those of ordinary skill in the art that the above parameters may vary, depending upon the system used, thickness of barrier material being removed, plasma type, and other parameters. Wafer bias may or may not be applied to increase the bombardment energy of the plasma species to push the barrier material further into the dielectric and to remove the copper oxide from the bottom of the via aperture. Increasing wafer bias may increase adhesion but may also lessen insulating/adhesive barrier layer coverage over the dielectric layer. A low wafer bias level, rather than no wafer bias results in a more controllable bombardment process and is preferred.

In addition, the plasma bombardment method of the present invention can be performed in any deposition chamber where a bias can be applied to provide directionality of the bombarding species. In the case of the Inova™ System described as an example above, the bombardment step can be performed in the HCM™ Ta or HCM™ Cu module with Ar ions as long as there is little or no net deposition of the barrier metal. For the HCM™ Ta or HCM™ Cu modules, the RF bias applied can be between about 0 kW and about 1,200 kW with the pressure ranging from about 2 mTorr to about 10 mTorr.

Figure 4:
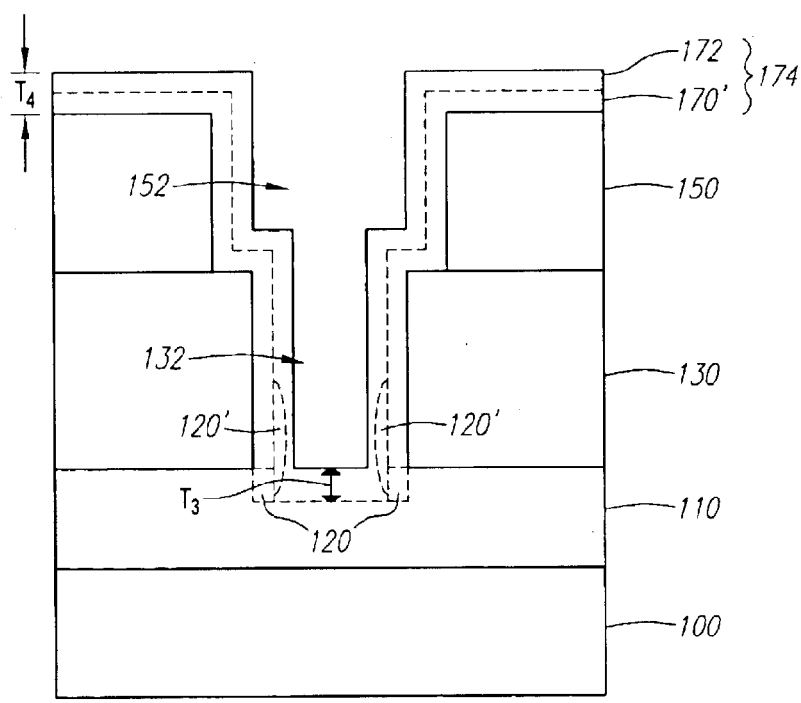
FIG. 4 shows a cross-section view of the structure illustrated in FIG. 3 after barrier material is again deposited.

After the plasma bombardment is performed, the same barrier material, in one example, is again deposited by CVD, PVD, or other appropriate methods to form a barrier layer 172 over barrier layer 170', as show in FIG. 4. Thus, barrier layer 174, comprised of barrier layer 170' and barrier layer 172, has improved adhesion properties. However, it is noted barrier layer 172 is not limited to the same barrier material as the underlying barrier layer 170' and may be a different barrier material than barrier layer 170. In one example, barrier layer 174 may be between about 5 Å and about 300 Å in thickness and is preferably about 50 Å in thickness over the top surface of dielectric layer 150 but is not limited to such a range. Furthermore, it is noted that a thickness $T_4$ of barrier layer 174 over the field region or top surface of dielectric layer 150 is greater than a thickness $T_3$ of barrier layer 172 at the bottom of via aperture 132. It is noted that thicknesses $T_4$ and $T_3$ may be but not necessarily the same as thicknesses $T_2$ and $T_1$ (FIG. 2), respectively. In one example, barrier layer 174 has a greater thickness $\Delta T(\Delta T = T_4 - T_3)$ over top surface of dielectric layer 150 than at the bottom of via aperture 132 between about 5 Å and about 200 Å.

In accordance with one embodiment of the present invention, the process steps of barrier material deposition, plasma bombardment, and re-deposition are performed sequentially, and may be performed within the same processing chamber, or alternatively within separate processing chambers. Additionally, the process steps of the present invention may be performed for multiple iterations to improve adhesion characteristics.

Advantageously, the method of the present invention allows for improved adhesion between the barrier layer and the dielectric layer. Metrics of adhesion include the four-point bend technique and CMP.

Based upon the four-point bend technique and theories in fracture mechanics, a critical fracture energy, $G_c$, can be applied to microelectronic thin film multi-layer structures as a quantitative zero-order approximation to measure the adhesion energy of thin films at an interface. The following equations may be used:

$$G_c = \frac{21(1-v^2)M^2}{4Eh^3} \tag{1}$$

where $G_c$ is the critical fracture energy, $v$ is the Poisson's ratio, E is the Young's modulus, h is the height of the sample, and M is the net bending moment per unit width, and $$M = \frac{Pl}{2b} \tag{2}$$

where P is the load, L is the horizontal distance between the top and bottom pin utilized with the four-point bend technique, and b is the width of the sample. It is noted that the critical fracture energy, $G_c$, shown in Equation 1, is derived by assuming that the materials sandwiching the thin films of concern being fractured is silicon, that the thin films are too thin to be considered, and there is no significant plastic deformation contribution from adjacent films.

CMP applies vertical, radial, and shear forces on the thin films such that delamination will occur if adhesion characteristics are not sufficient. Furthermore, chemical interactions at the interface during CMP may result in delamination. CMP is typically utilized during a planarization step to remove metal overlying the insulator after filling of the contact apertures.

Conventional preclean methods utilizing a treatment including Ar plasma prior to TiN deposition resulted in $G_c$ values of about 2.2 J/m$^2$ and TiN/SiOC layers not passing CMP, whereas TiN/SiO$_2$ interfaces with a fracture energy of greater than about 5 J/m$^2$ will pass CMP. In accordance with a method of the present invention, a $G_c$ value of about 5.6 J/m$^2$ and no delamination during CMP were achieved on TiN/SiOC layers. $Q_c$ values between the barrier layer and dielectric layer have been increased between about 2 J/m$^2$ and about 4 J/m$^2$ utilizing the present invention.

Figure 5:
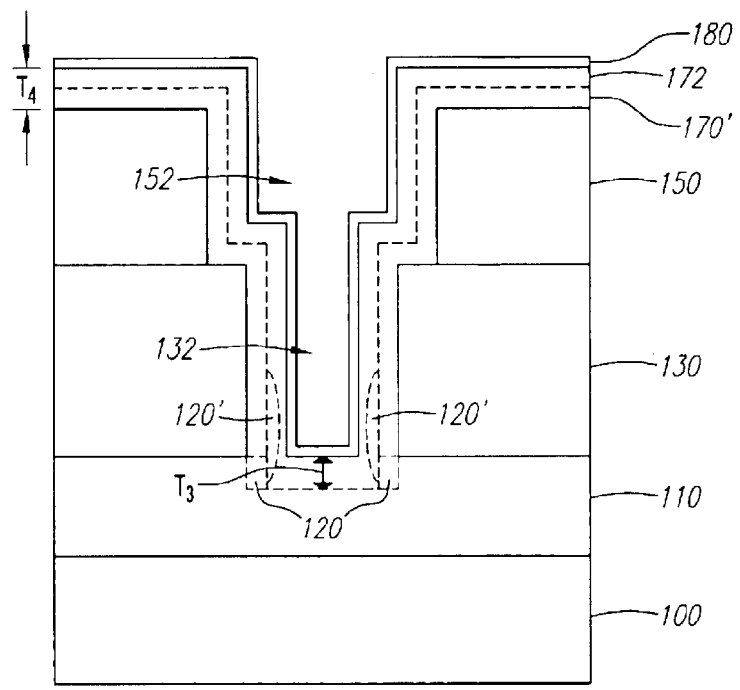
FIG. 5 shows a cross-section view of the structure illustrated in FIG. 4 after a metal seed layer is deposited.
Figure 6:
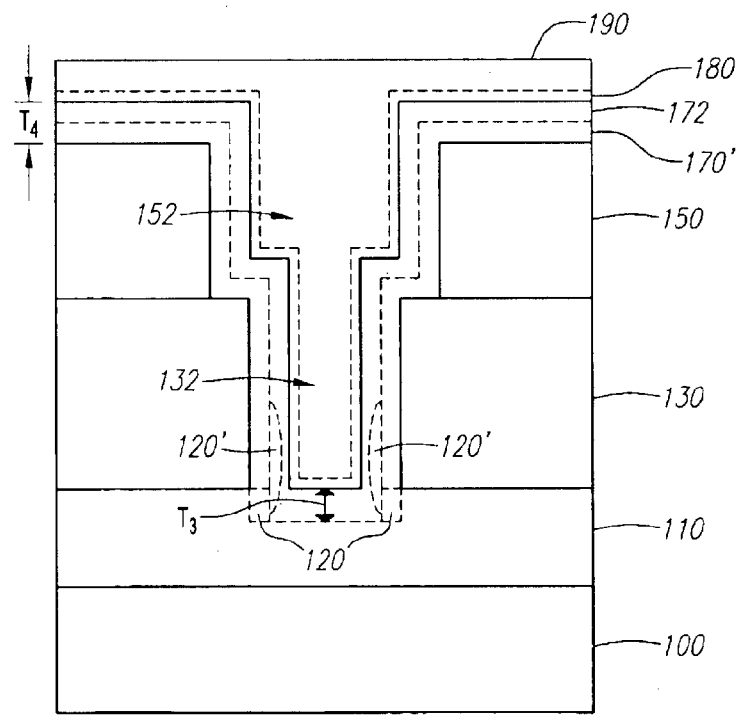
FIG. 6 shows a cross-section view of the structure illustrated in FIG. 5 after a metal fill process.
Figure 7:
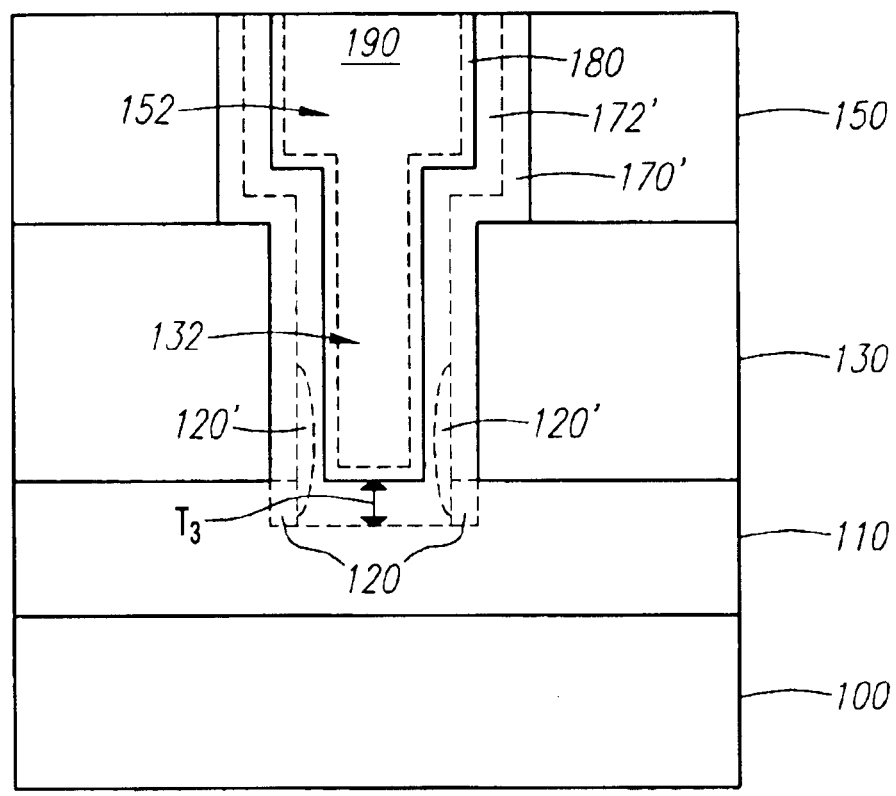
FIG. 7 shows a cross-section view of the structure illustrated in FIG. 6 after a planarization process.

After formation of barrier layer 172, a copper seed layer 180 may be conformably deposited over barrier layer 172, as illustrated in FIG. 5. Via aperture 132 and line aperture 152 may then be filled with a copper material 190, in one example, as illustrated in FIG. 6. The fill process may be a conventional CVD or electroplating process. Finally, the copper fill is followed by a planarization step, such as CMP, which completes formation of the dual damascene line/via structure, as shown in FIG. 7. Another line/via level (not shown) can be added by depositing a hard mask, such as silicon nitride, insulator/dielectric material, such as silicon dioxide, and a photoresist mask and following the previously described steps.

The above-described embodiments of the present invention are merely meant to be illustrative and not limiting. Various changes and modifications may be made without departing from this invention in its broader aspects. For example, the methods of the present invention can be employed not only in the formation of dual-damascene structures, but also in the formation of single damascene structures. Therefore, the appended claims encompass all such changes and modifications as fall within the true spirit and scope of this invention.

What is claimed is:

1. A method to improve barrier layer adhesion, comprising:

providing a semiconductor structure comprising a dielectric layer overlying a metal layer;

etching an aperture through said dielectric layer to expose a portion of said metal layer;

depositing a first barrier material to form a barrier layer over said dielectric layer and over said exposed first portion of said metal layer, said barrier layer having a greater thickness over said dielectric layer than over said exposed portion of said metal layer;

bombarding said barrier layer with a plasma to push barrier material into said dielectric layer, said bombarding leaving a portion of said barrier layer over a top surface of said dielectric layer; and depositing a second barrier material over said portion of said barrier layer and over said aperture.

2. The method of claim 1, wherein said metal layer comprises copper.

3. The method of claim 1, wherein said first barrier material is selected from the group consisting of tantalum (Ta), tantalum nitride (taN), titanium nitride (TiN), titanium silicon nitride (TiSiN), tungsten (W), tungsten nitride (WN), tungsten silicon nitride (WSiN), and tantalum silicon nitride (TaSiN).

4. The method of claim 1, wherein said first barrier layer prior to said bombarding has a thickness between about 5 Å and about 300 Å.

5. The method of claim 1, wherein said bombarding exposes a second portion of said metal layer at a bottom region of said aperture.

6. The method of claim 1, wherein said bombarding is performed with a plasma comprising Ar, He, $N_2$, or $H_2$.

7. The method of claim 6, wherein said bombarding is performed with a source power between about 100 W and about 3,000 W and a wafer bias between about 0 W and about 1,000 W.

8. The method of claim 1, wherein said portion of said first barrier layer has a thickness between about 1 Å and about 20 Å.

9. The method of claim 1, wherein said dielectric layer is selected from the group consisting of silicon oxide materials, organic polymers, and inorganic polymers.

10. The method of claim 1, wherein said second barrier material is selected from the group consisting of tantalum (Ta), tantalum nitride (TaN), titanium nitride (TiN), titanium silicon nitride (TiSiN), tungsten (W), tungsten nitride (WN), tungsten silicon nitride (WSiN), and tantalum silicon nitride (TaSiN).

11. The method of claim 1, wherein said greater thickness is between about 5 Å and about 200 Å.

12. The method of claim 1, wherein said second barrier material is the same a said first barrier material.

13. The method of claim 1, wherein said second barrier material is different from said first barrier material.

14. The method of claim 1, wherein said aperture is a damascene structure.

15. The method of claim 14, further comprising:

filling said aperture with a metal over said barrier layer; and planarizing said metal and said barrier layer without delamination of said barrier layer from said dielectric layer.

16. The method of claim 1, wherein said planarizing is performed by chemical-mechanical polish (CMP).

* * * * *